(12) United States Patent
Gangl et al.

(10) Patent No.: US 6,754,864 B2
(45) Date of Patent: Jun. 22, 2004

(54) SYSTEM AND METHOD TO PREDETERMINE A BITMAP OF A SELF-TESTED EMBEDDED ARRAY

(75) Inventors: David V. Gangl, Essex Junction, VT (US); Matthew Sean Grady, Burlington, VT (US); David John Iverson, Underhill, VT (US); Gary William Maier, Burlington, VT (US); Robert Edward Shearer, Richmond, VT (US); Donald Lawrence Wheater, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 442 days.

(21) Appl. No.: 09/791,003

(22) Filed: Feb. 22, 2001

(65) Prior Publication Data

US 2002/0116676 A1 Aug. 22, 2002

(51) Int. Cl.$^7$ ............................................... G01R 31/28
(52) U.S. Cl. ........................................ 714/733; 714/732
(58) Field of Search ................................ 714/737, 733, 714/711; 365/200

(56) References Cited

U.S. PATENT DOCUMENTS

| | | | |
|---|---|---|---|
| 4,194,113 A | | 3/1980 | Fulks et al. |
| 4,441,074 A | | 4/1984 | Bockett-Pugh et al. |
| 5,475,694 A | * | 12/1995 | Ivanov et al. ................ 714/732 |
| 5,557,619 A | * | 9/1996 | Rapoport ..................... 714/733 |
| 5,652,754 A | * | 7/1997 | Pizzica ........................ 714/732 |
| 5,727,000 A | | 3/1998 | Pizzica |
| 5,841,867 A | * | 11/1998 | Jacobson et al. ........... 713/187 |
| 5,850,404 A | * | 12/1998 | Sanada ........................ 714/745 |
| 5,859,804 A | * | 1/1999 | Hedberg et al. ............ 365/201 |
| 5,920,515 A | * | 7/1999 | Shaik et al. ................ 365/200 |
| 6,105,155 A | * | 8/2000 | Cheng et al. ............... 714/736 |
| 6,535,999 B1 | * | 3/2003 | Merritt et al. ............... 714/30 |

OTHER PUBLICATIONS

Savir, "Shrinking Wide Compressors [BIST]", Computer–Aided Design of Integrated Circuit and Systems, IEEE Transactions on, Nov. 1995, vol. 14, p. 1379–1387.*

* cited by examiner

Primary Examiner—Guy Lamarre
(74) Attorney, Agent, or Firm—Scully, Scott, Murphy & Presser; Robert A. Walsh, Esq.

(57) ABSTRACT

A built-in self-test (BIST) system and method for testing an array of embedded electronic devices, the BIST comprising: a shift register device connected to an output pin of an embedded array of electronic devices being tested and for receiving a failure indication signal at a real-time output pin of the device under test, the shift register generating a unique signature in response to receipt of the failure indication; a device for determining whether the generated unique signature is represented in a table comprising known signature values and corresponding bitmaps of prior determined array defects for that device under test; wherein the need to bitmap the array is avoided when a known failure signature is determined.

15 Claims, 2 Drawing Sheets

SYSTEM AND METHOD TO PREDETERMINE A BITMAP OF A SELF-TESTED EMBEDDED ARRAY

BACKGROUND OF THE INVENTION

1. Field of the Invention

This invention relates generally to systems for testing electronic circuits, and more specifically, to a novel Array Build-In Self-Test (ABIST) circuit and methodology for determining bitmaps of circuit defects in embedded microprocessor arrays.

2. Discussion of the Prior Art

Embedded arrays of microprocessors are commonly tested using Array Built-In Self-Test ("ABIST"). In order to produce a 2-dimensional map of array defects (called a bit-fail map or "bitmap") many ABIST designs include a signal which indicates a fail has been detected on an ABIST cycle. This signal is routed to an external pin on the product (called a real-time pin), and can be monitored by the device tester. In the classic manner of creating bitmaps using such a scheme, the tester creates a list of the failing cycles, and then, in a separate set of ABIST executions, runs the ABIST machine to the failing cycle and performs a latch scan-out of the internal state of the ABIST machine.

The problem with this scheme is that it is very time consuming. Multiple executions of the ABIST machine are necessary to collect the fail data. In many instances, the data is not unique from one device to the next. For example, a catastrophic fail of the array would create a bitmap showing every cell in the array is defective. Thus, it would be highly desirable to provide for an ABIST, a mechanism for creating bitmaps only when they are unique.

Other approaches for addressing the problem of too much test time have involved the collection of partial data, rather than all the data, and assuming that the fail continues (i.e., what appears to be a bitline is a bitline). However, this solution runs the risk of incorrectly identifying the failing mechanism (i.e., a partial bitline rather than a full bitline fail). In addition, even though this technique reduces the number of ABIST executions, it still requires multiple reruns which collect non-unique data.

It would thus additionally be highly desirable to provide for an ABIST, a mechanism for eliminating extra data collection executions in the determination of bitmaps.

SUMMARY OF THE INVENTION

It is an object of the present invention to provide an Array Built-in Self-test (ABIST) system and methodology for testing embedded electronic circuits having a mechanism for creating bitmaps of failures only when they are unique.

It is another object of the present invention to provide an Array Built-in Self-test (ABIST) system and methodology for testing embedded electronic circuits having a mechanism for eliminating extra data collection executions in the determination of bitmaps for locating circuit defects.

According to the invention, there is provided a built-in self-test (BIST) system and method for testing an array of embedded electronic devices, the BIST comprising: a shift register device connected to an output pin of an embedded array of electronic devices being tested and for receiving a failure indication signal at a real-time output pin of the device under test, the shift register generating a unique signature in response to receipt of the failure indication; a device for determining whether said generated unique signature is represented in a table comprising known signature values and corresponding bitmaps of prior determined array defects for that device under test; wherein the need to bitmap the array is avoided when a known failure signature is determined.

For this scheme to work, a table of signatures would have to be created. This can be done by creating a bitmap for those devices which exhibit what is suspected to be a common failing mode, as well as the associated signature from the real-time fail pin.

Advantageously, such a system and method of the invention conserves test time through the elimination of extraneous data collection by creating a signature at the same time that the initial ABIST execution is performed so that extra data collection executions in the determination of bitmaps may be eliminated.

BRIEF DESCRIPTION OF THE DRAWINGS

Further features, aspects and advantages of the apparatus and methods of the present invention will become better understood with regard to the following description, appended claims, and the accompanying drawings where:

DETAILED DESCRIPTION OF THE PREFERRED EMBODIMENTS

Figure 1:
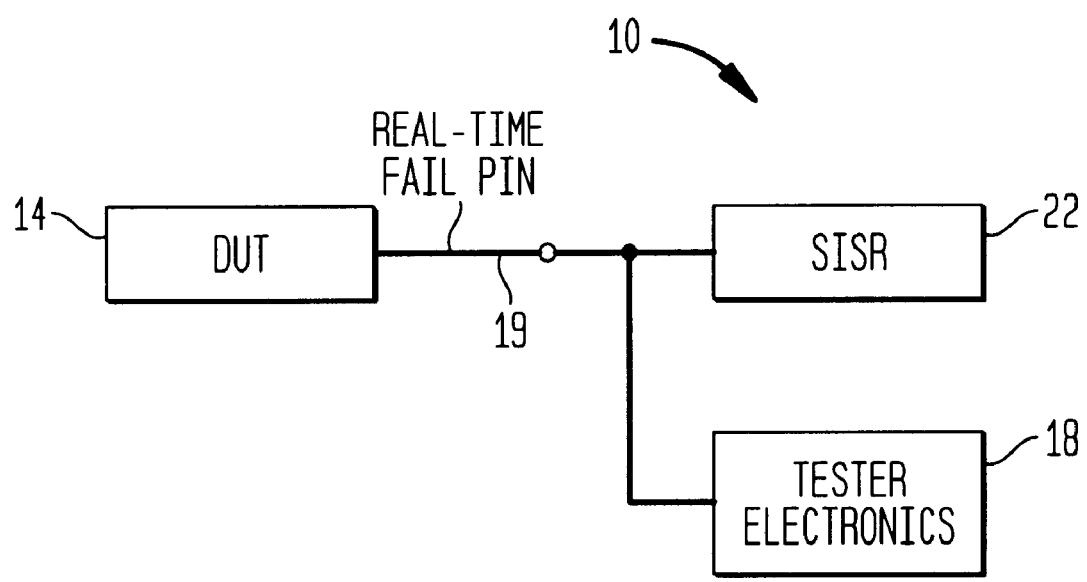
FIG. 1 is a block diagram illustrating the ABIST test generator system 10 according to the invention.

FIG. 1 is a block diagram depicting the architecture of the inventive ABIST system 10 that includes the device under test ("DUT") 14, and, the tester electronics 18 for applying the testing signals to the DUT. In order to save time in data collection by creating bitmaps only when they are unique, a Single Input Shift Register (SISR) device 22 is connected to the real-time fail pin output 19 from the DUT 14 for receiving the output fail signal of the DUT. The SISR is a shift register that generates a plurality of unique "signatures" in accordance with a clock input. Thus, depending upon the size of the SISR, a plurality of unique signatures may be generated, for example, a 32 bit SISR will generate $2^{32}$ unique signatures. Assuming an ABIST test occurring at every clock cycle, a unique signature may be generated that corresponds to each ABIST test.

As shown in FIG. 1, the SISR operates in parallel with the tester electronics 18 (i.e., the normal driver/detector pair), hence no overtime is incurred in collecting the signature. Consequently, no additional ABIST executions are required to collect the fail data. Thus, the device and approach of the invention is such that extra executions for bitmap data are eliminated, as the signature may be created at the same time that the initial ABIST execution is performed. In this manner a signature that is unique to the fail may be generated. In accordance with the preferred embodiment, at the conclusion of the execution of the ABIST, the signature may be compared to a table of known fail signatures. If there is a match, the bitmap need not be created, as there already exists a correlation between a signature and a particular bitmap.

Thus, according to the invention, a table of signatures is created ahead of time with each associated signature from the real-time fail pin having a corresponding bitmap for those devices which exhibit what is suspected to be a common failing mode. For example, Pareto charts maybe generated ahead of time to determine random and non-random types of DUT defects.

Figure 2:
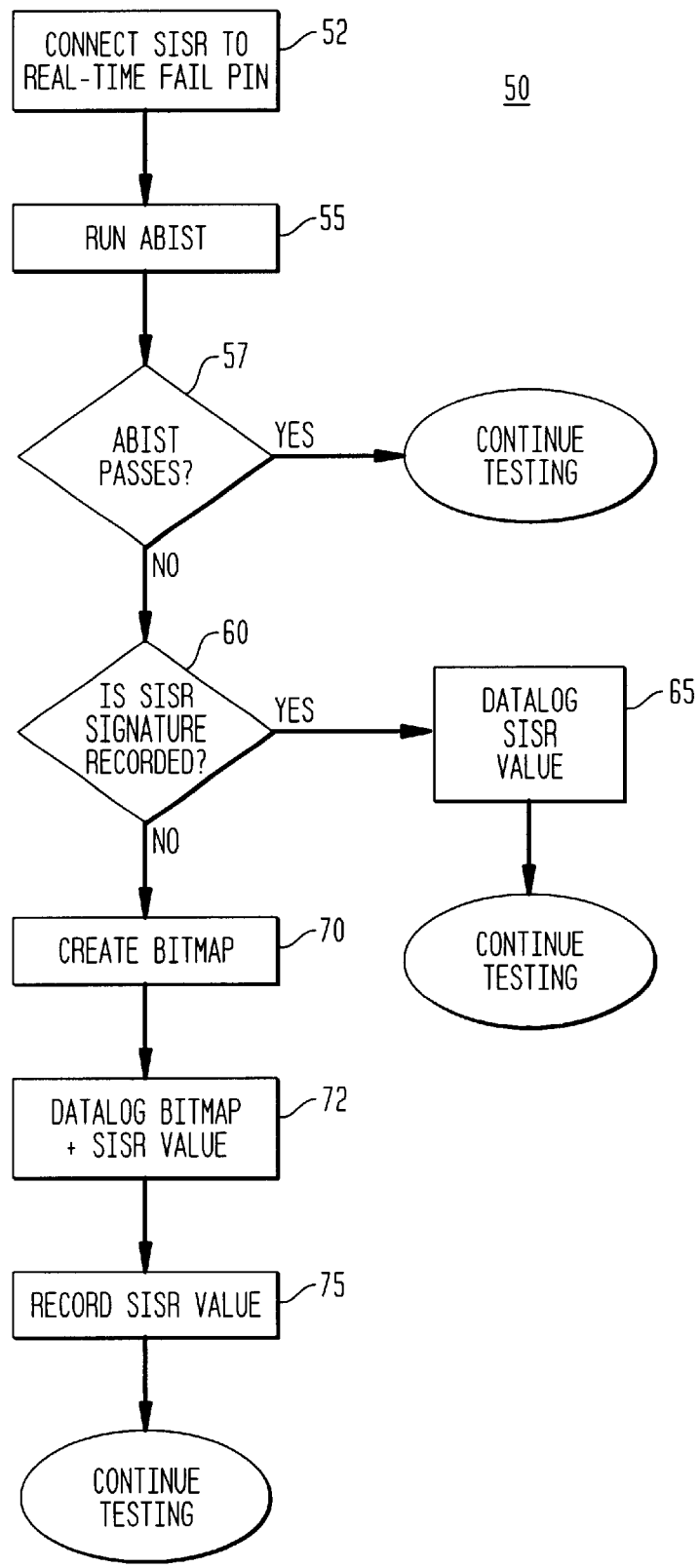
FIG. 2 is a flow chart depicting the method for predetermining a bitmap using Single Input Shift Register (SISR) signatures according to the invention.

FIG. 2 is a flow chart depicting the method 50 for predetermining a bitmap using SISR signatures according to the invention. As shown in FIG. 2, a first step 52 is to connect the SISR to the real-time fail pin and provide an initial seed to the SISR (usually zero). Then, at step 55, the ABIST test for the device is executed. At step 57, if the ABIST test passes, then there are no defects to be mapped and testing is continued, e.g. by returning to step 55. If at step 57 it is determined that the ABIST test has failed, i.e., there is a defect in an embedded array, then a decision is made at step 60 as to whether the SISR signature corresponding to that test has already been recorded. To determine whether the SISR has already been recorded, the SISR signature is retrieved from the tester and a look-up is performed in a table of known SISR signatures to determine whether the signature exists. If it is determined that a signature exists, then a bitmap for this signature has already been created and does not need to be created. For reference, the SISR signature is entered into the device test data log at step 65 and testing continues, e.g. by returning to step 55. Otherwise, at step 60, if the signature is not in the table, then a bitmap is created for the device at step 70. Particularly, the SISR signature and the bitmap are entered into the device test data log at step 72 and at step 75, the SISR signature is entered into the table of known SISR signatures, as a bitmap now exists for it.

While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims.

Having thus described our invention, what we claim as new, and desire to secure by Letters Patent is:

1. A built-in self-test (BIST) system for testing of embedded electronic devices, said BIST comprising:

single-input shift register device connected to a single output pin of an embedded array of electronic devices being tested and for receiving a real-time output result in response to each executed BIST test of said device under test, said single-input shift register generating a unique signature in response to receipt of a failure indication at said single output pin;

a device for determining whether each said generated unique signature is represented in a table comprising known signature values and corresponding bitmaps of prior determined array defects for that device under test, wherein the need to bitmap the array is avoided when a known failure signature is determined.

2. A built-in self-test (BIST) system for testing as claimed in claim 1, wherein said determining device includes a comparator device for comparing said generated unique signature against said storage device of known signatures.

3. A built-in self-test (BIST) system for testing as claimed in claim 1, further comprising mechanism for determining a bit-map of array defects for correlation with a unique signature determined not to be represented in said storage device.

4. A method for testing embedded electronic devices comprising the steps of:

a) providing a single-input shift register device at a single output pin of an embedded array of electronic devices under test, said single-input shift register device configured for receiving a real-time output result in response to each executed BIST test of a device under test and generating a unique signature in response to receiving a failure indication at said single output pin;

b) determining, in response to a failure indication signal, whether said generated unique signature is represented in a table comprising known signature values and corresponding bitmaps of prior determined array defects for that device under test, wherein the need to bitmap the array is avoided when a known failure signature is determined.

5. The method as claimed in claim 4, wherein if at step b) said generated unique signature is determined to be in said table, the step of logging receipt of said unique signature for a failed test, wherein the need to bitmap the array to determine said defects is avoided for that test.

6. The method as claimed in claim 4, wherein if said generated unique signature is determined not to be in said table, the steps of:

determining the defects of said array as a result of a failed test and generating a corresponding bitmap for the array, correlating said generated bit map with said unique signature for said failed test.

7. The method as claimed in claim 6, further including the step of logging receipt of said unique signature far a failed test.

8. The method as claimed in claim 6, further including the step of updating said table with said new signature value and corresponding bitmaps.

9. The method as claimed in claim 6, wherein prior to conducting an ABIST test for a device, a step of generating Pareto charts to determine random and non-random types of array defects fir inclusion in said table having known signature values and corresponding bitmaps for that device.

10. A program storage device readable by machine, tangibly embodying a program of instructions executable by the machine to perform method steps for testing embedded electronic devices, said method comprising the steps of:

a) providing a single-input shift register device at a single output pin of an embedded array of electronic devices under test, said single-input shift register device configured for receiving a real-time output result in response to each executed BIST test of a device under test and generating a unique signature in response to receiving a failure indication at said single output pin;

b) determining, in response to a failure indication signal, whether said generated unique signature is represented in a table comprising known signature values and corresponding bitmaps of prior determined array defects for that device under test, wherein the need to bitmap the array is avoided when a known failure signature is determined.

11. The program storage device readable by machine as claimed in claim 10, wherein if at step b) said generated unique signature is determined to be in said table, the step of logging receipt of said unique signature for a failed test, wherein the need to bitmap the array to determine said defects is avoided for that test.

12. The program storage device readable by machine as claimed in claim 11, wherein if said generated unique signature is determined not to be in said table, the steps of:

determining the defects of said array as a result of a failed test and generating a corresponding bitmap for the array, correlating said generated bit map with said unique signature for said failed test.

13. The program storage device readable by machine as claimed in claim 12, further including the step of logging receipt of said unique signature for a failed test.

14. The program storage device readable by machine as claimed in claim 12, further including the step of updating said table with said new signature value and corresponding bitmaps.

15. The program storage device readable by machine as claimed in claim 12, wherein prior to conducting an ABIST test for a device, a step of generating Pareto charts to determine random and non-random types of array defects for inclusion in said table having known signature values and corresponding bitmaps for that device.

* * * * *